United States Patent [19]
Bergemont

[11] Patent Number: 5,969,406
[45] Date of Patent: Oct. 19, 1999

[54] HIGH LINEARITY CAPACITOR USING A DAMASCENE TUNGSTEN STUD AS THE BOTTOM ELECTRODE

[75] Inventor: Albert Bergemont, Palo Alto, Calif.

[73] Assignee: National Semiconductor, Santa Clara, Calif.

[21] Appl. No.: 09/038,202

[22] Filed: Mar. 10, 1998

[51] Int. Cl.⁶ .................................................. H01L 29/43
[52] U.S. Cl. .......................................... 257/535; 257/532
[58] Field of Search ..................................... 257/532, 535

[56] References Cited

U.S. PATENT DOCUMENTS

| | | | |
|---|---|---|---|
| 4,831,431 | 5/1989 | Hanlon ..................................... | 257/535 |
| 5,406,442 | 4/1995 | Miyazaki ................................. | 257/535 |
| 5,479,316 | 12/1995 | Smrtic et al. ........................... | 257/535 |
| 5,773,314 | 6/1998 | Jiang et al. .............................. | 438/3 |

FOREIGN PATENT DOCUMENTS 63-045849   2/1988   Japan ...................................... 257/535

OTHER PUBLICATIONS

C. Koburger, III et al., "A Half–Micron CMOS Logic Generation", *IBM J. Res. Develop.* 39:1/2 215–227 (Jan./Mar. 1995).

J. McCreary, "Matching Properties and Voltage and Temperature Dependence of MOS Capacitors", *IEEE J. of Solid State Circuits*, 5C16:6 p. 608 (Dec. 1981).

S. Subbanna et al., "A High–Density 6.9 sq. μm Embedded SRAM Cell in a High–Performance 0.25 μm–Generation CMOS Logic Technology", *International Electron Devices Meeting*, 275–278 (1996).

S. Subbanna et al., "A Novel Borderless Contact/Interconnect Technology Using Aluminum Oxide Etch Stop for High Performance SRAM and Logic", *International Electron Devices Meeting*, 441–444 (1993).

F. White et al., "Damascene Stud Local Interconnect in CMOS Technology", *International Electron Devices Meeting*, 301–304 (1992).

*Primary Examiner*—David B. Hardy
*Attorney, Agent, or Firm*—Limbach & Limbach LLP

[57] ABSTRACT

The present invention sets forth a process of making, and a device comprising, a capacitor with a damascene tungsten lower electrode. The capacitor is manufactured by first depositing an insulating nitride layer on a field oxide layer, followed by deposition of a layer of oxide on the nitride layer. A gap is etched into both the nitride and oxide layers, wherein a lower electrode comprising a damascene tungsten stud is deposited following deposition of a Ti/TiN liner for the stud. An oxide layer is next formed over the stud having a conducting tungsten channel with another Ti/TiN liner disposed therethrough and connecting with the stud. Then, a metal layer is deposited and etched to form both a contact for the stud via connection to the channel, and an upper electrode insulated from the contact. The resulting capacitor is one having a damascene tungsten lower electrode exhibiting high linearity and sound matching characteristics, and is versatile for use with analog circuits and manufacturable at a thickness of significantly less than one micron.

22 Claims, 2 Drawing Sheets

HIGH LINEARITY CAPACITOR USING A DAMASCENE TUNGSTEN STUD AS THE BOTTOM ELECTRODE

TECHNICAL FIELD

The present invention relates to the manufacture of integrated circuit (IC) devices and, in particular, to fabrication of a high linearity capacitor using a damascene tungsten stud as the bottom electrode for use in an integrated circuit device.

DISCUSSION OF THE RELATED ART

Perhaps the most widely used material for forming capacitors in integrated circuit devices is polysilicon (poly). The oxide layer thickness that separates the two electrodes of the poly to poly capacitor is in the range of 400–500 angstroms. Poly to poly capacitors exhibit good matching and have fair to good linearity, compared with typical semiconducting material capacitors.

However, each polysilicon electrode has a depletion region associated with it which produces a nonlinear capacitance, especially as compared with that of a typical metal to metal capacitor. To minimize depletion region effects, the doping level in each polysilicon plate has to be optimized. The usual dopant is phosphorus. The optimization is not straight forward, and depends on the thermal budget and dopant distribution. Polysilicon capacitor fabrication is expensive and even with optimized dopant distribution in each plate, the linearity of the polysilicon capacitor is not as good as that which metal to metal capacitors can provide.

Conventional metal to metal capacitors exhibit great linearity since there is no depletion region associated with the metal electrodes. In fact, nearly all the stored charge resides at the inner surfaces of the metal electrodes. Metal to metal capacitors are also very inexpensive to fabricate. However, it is difficult to minimize the variation in the thickness of the oxide layer between the metals. This difficulty gives rise to poor matching characteristics. Also, the oxide layer of the metal to metal is typically on the order of 1 micron thick. It is desired, however, to have capacitors as IC elements which are significantly less than a micron in thickness, in order to minimize area without reducing capacitance.

A third type of capacitor utilized in IC devices is a crystalline silicon to metal capacitor. These capacitors are little used because they exhibit larger parasitic effects than their poly to poly counterparts, and the silicon must be optimally doped to minimize depletion effects in the capacitor electrodes. Also, capacitor coupling to silicon generates noise problems.

Damascene Tungsten has been used in IC devices before. Particularly, it has been used as a low resistance, planar local interconnect in CMOS embedded SRAM cells, to significantly improve SRAM density and wireability.

SUMMARY OF THE INVENTION

It is desired to have a capacitor which exhibits high linearity and suitable matching characteristics. The capacitor of the present invention exhibits high linearity much as would a conventional metal to metal capacitor, and further exhibits sound matching characteristics.

It is further desired to have a capacitor whose thickness is versatile to suit analog circuit applications, and is yet manufacturable with an oxide layer having a thickness of significantly less than one micron. The capacitor of the present invention is versatile to suit analog circuit applications and may be fabricated with a thickness of significantly less than one micron.

The present invention solves the aforementioned problems associated with conventional IC capacitor technology by setting forth a process of making, and a device comprising, a capacitor with a damascene tungsten lower electrode. The capacitor is manufactured by first depositing an insulating nitride layer on a field oxide, followed by forming a layer of oxide on the nitride layer. A gap is etched into both the nitride and oxide layers, wherein a lower electrode comprising a damascene tungsten stud is deposited following deposition of a Ti/TiN liner for the stud. An oxide layer is next formed over the stud having a conducting channel disposed therethrough and connecting with the stud. Then, a metal layer is deposited and etched to form both a contact for the stud via connection to the channel and an upper electrode insulated from the contact. The resulting capacitor is one having a damascene tungsten lower electrode and metal upper electrode exhibiting high linearity and sound matching characteristics, and is versatile for use with analog circuits and manufacturable at a thickness of significantly less than one micron.

DETAILED DESCRIPTION OF THE PREFERRED EMBODIMENTS

Figure 1A:
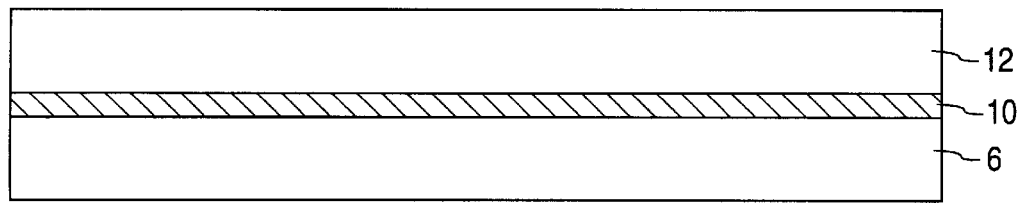
FIG. 1A shows an insulating nitride layer and an oxide layer deposited on a field oxide layer in accordance with a first step of a preferred method of the present invention.

FIGS. 1A–1D illustrate a method of fabricating a high linearity capacitor according to a preferred embodiment of the present invention. FIG. 1A shows a nitride layer 10 deposited onto a field oxide 6. The field oxide 6 preferably has a thickness around 0.5 microns. The field oxide 6 may or may not be on a silicon substrate 7, as shown in FIG. 1A. The silicon substrate 7 may be undoped or doped, p-type or n-type, and may be lightly or heavily doped. A plurality of IC device components may be fabricated on the substrate 7 along with the high linearity capacitor. These several device components may be electrically interconnected or may be isolated electrically from each other and/or the high linearity capacitor. The substrate 7 may be cut after processing into several substrates or integrated circuit chips or devices.

The nitride layer 10 is deposited using a conventional deposition technique, such as low pressure chemical vapor deposition (LPCVD). Constituents of the nitride layer are preferably characterized by the chemical formula $Si_3N_4$. An undoped oxide or phosphosilicate glass (PSG) layer 12 is next deposited on the upper surface of the nitride layer 10. If PSG is used, any technique specifically conventionally used for deposition of PSG may be performed to produce the PSG layer 12. CMP is preferably performed after deposition of the oxide or PSG layer 12 to smooth and pacify the upper surface of the layer 12.

Figure 1B:
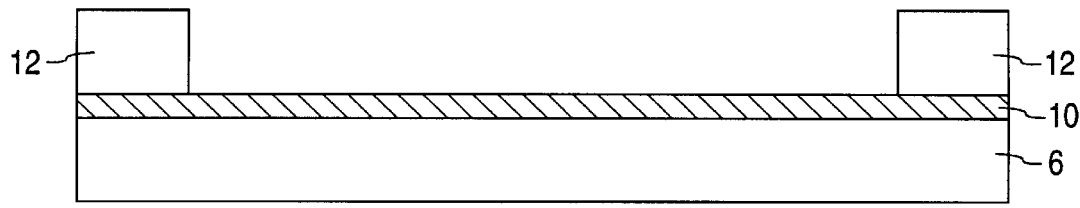
FIG. 1B shows the structure of FIG. 1A wherein the oxide layer has a gap etched through it in accordance with the preferred method of FIG. 1A.
Figure 1C:
FIG. 1C shows the structure of FIG. 1B wherein the nitride layer has a gap etched through it in accordance with the preferred method of FIGS. 1A and 1B.

FIG. 1B shows a portion of the oxide layer 12 etched away down to the nitride layer 10. This etching is dry and may be reactive ion etching (RIE). FIG. 1C next shows the portion of the nitride layer 10 beneath the portion of the oxide layer 12 just etched away, also etched away down to the field oxide 6. Preferably an etchant which is selective to the nitride layer 10 is used to ensure that the underlying material(s) is/are not attacked. Two separate etching steps are preferably performed, one for each of the oxide layer 12 and the nitride layer 10. After the etching is completed, a gap remains defined by the field oxide 6 at the bottom and by the sidewalls of the etched oxide 12 and the nitride 10. The inner wall surfaces of the gap are preferably substantially vertical.

Figure 1D:
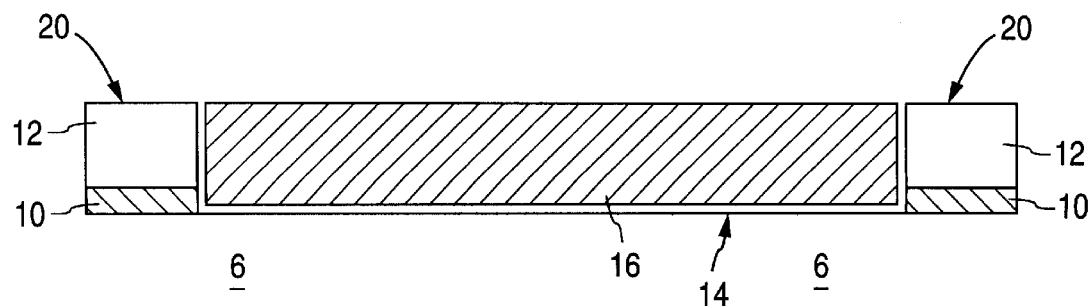
FIG. 1D shows a damascene tungsten stud which has been deposited into the gap of FIG. 1C in accordance with the preferred method of FIGS. 1A–1C.

Referring to FIG. 1D, a first thin liner 14 of titanium and titanium nitride (Ti/TiN) is then deposited onto the surfaces defining the gap. The Ti/TiN deposition may be performed in any conventional manner including CVD, electron beam or thermal evaporation vacuum deposition or sputtering.

A damascene tungsten stud 16 is next deposited into the gap over the first liner 14. The tungsten stud 16 is deposited to fill the gap entirely such that it is substantially level with remaining portions of the oxide layer 12. A CMP step is next performed to smooth and pacify the upper surface 18 of the tungsten stud 16 and to planarize it with the upper surfaces 20 of the remaining oxide portions 12.

Figure 2:
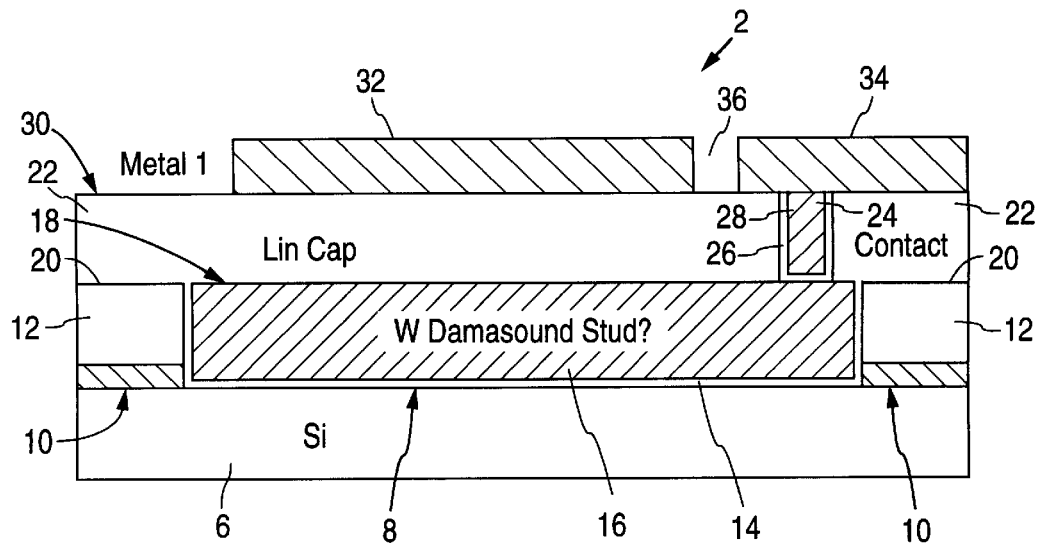
FIG. 2 shows a capacitor according to a preferred embodiment of the present invention, and/or manufacturable by the preferred method of FIGS. 1A–1D.

At this point, the tungsten stud 16 is preferably only making electrical and/or physical contact with the first liner 14, while the first liner 14 is in contact at various portions with the inner walls of the remaining oxide 12 and nitride 10 layers, and the field oxide 6. Referring to FIG. 2, an insulating layer 22, which is preferably an oxide layer, is then formed on the upper surfaces 18,20 of the tungsten stud 16 and the remaining portions of the oxide layer 12. The oxide layer 22 is deposited on these upper surfaces 18,20 using CVD either at low or high pressure, and either low or high density plasma enhanced, or traditionally. The oxide layer 22 may be pure $SiO_2$ or a doped layer of $SiO_2$, with any dopant conventionally used.

A conducting channel 24 is next formed through the oxide layer 22 using conventional oxide etch techniques. Material filling the conducting channel 24 electrically couples with the damascene tungsten stud 16. A second liner 26, which is preferably also Ti/TiN, is preferably deposited within the channel 24, after the channel 24 is formed and defined by the walls of the oxide layer 22 and the damascene tungsten stud 16 beneath. Next, a conducting conduit 28, which is preferably tungsten is deposited into the channel 24 to fill the channel 24. The tungsten conduit 28 is deposited to fill the gap entirely such that it is substantially level with the remaining portions of the oxide layer 22. Then, a CMP step is performed to smooth the upper surface of the tungsten conduit and to planarize it with the upper surface of the oxide layer 22.

A metal layer is then deposited and patterned to define, in part, an upper electrode 32 on the upper surface 30 of the oxide layer 22. The upper electrode 32 lies above the damascene tungsten stud 16, and is electrically insulated from it by the oxide 22. As shown in FIG. 2, the patterned metal layer also includes a contact 34 which is in electrical contact with the damascene tungsten stud 16 via the damascene tungsten conduit 24 and second liner 26. The arrangement of the damascene tungsten stud 16, the upper electrode 32 and the intermediate oxide layer 22 define the capacitor electrodes and the separating dielectric layer, respectively. Alternatively, polysilicon may be used instead of metal as the upper electrode 32.

Figure 3:
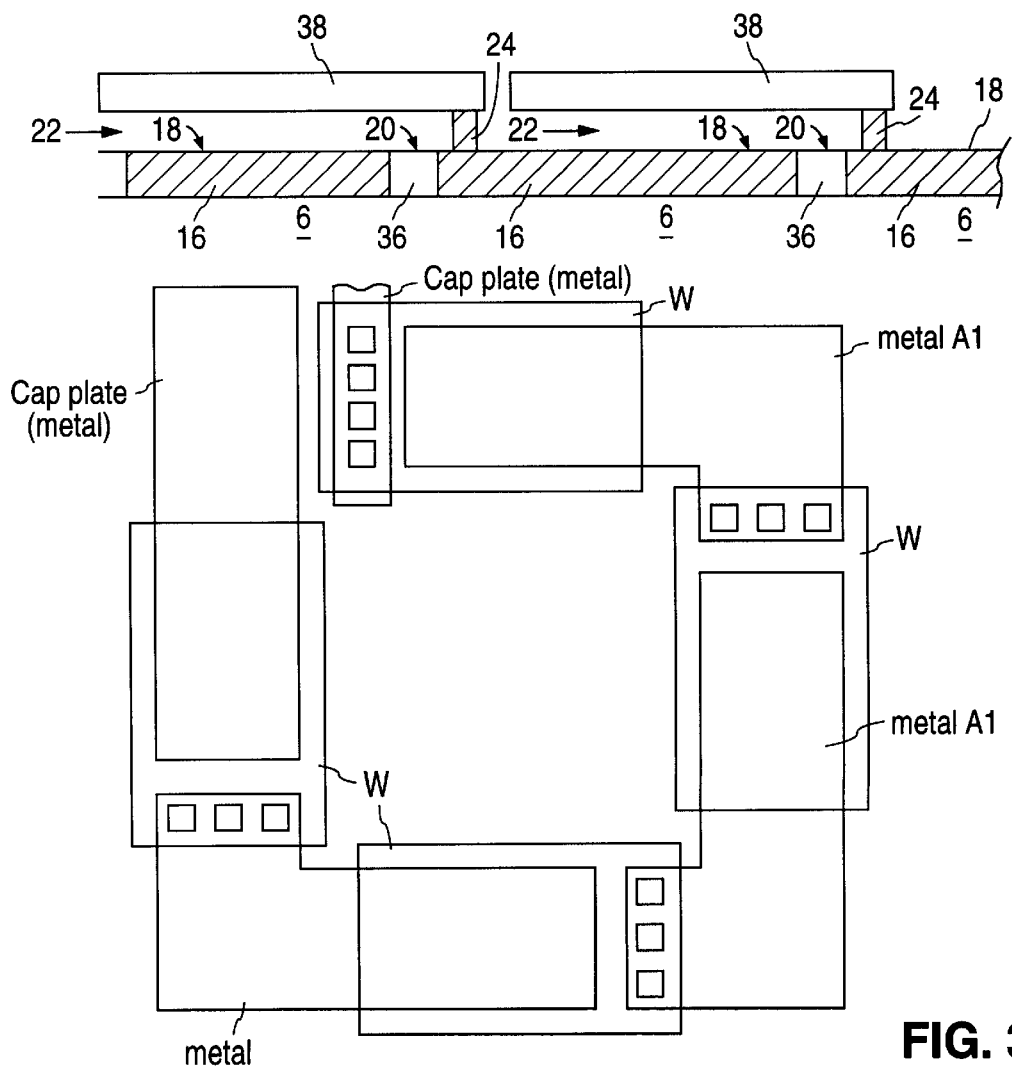
FIG. 3 shows multiple capacitors, each being in accordance with the preferred embodiment of FIG. 2, connected in series.

Referring to FIG. 3, in another embodiment of the present invention, multiple high-linearity capacitors 2 of the type described above are connected in series to reduce the overall capacitance of the combination. In this embodiment, a plurality of damascene tungsten studs 16 are formed in gaps in a manner similar to that described above. The upper electrodes 38 of adjacent capacitors serve as contacts to the lower electrodes of their neighboring capacitors as shown in FIG. 3. In this way, the voltage applied over the entire series combination is divided over the individual capacitors, and the capacitance is reduced. For example, if n capacitors of equal capacitance, C, are connected in series, the overall capacitance of the combination is $C_{Total}=C/n$.

What is claimed is:

1. A capacitor with a damascene tungsten stud as a lower electrode for use with an integrated circuit device, comprising:

an upper electrode;

a lower electrode comprising a damascene tungsten stud; and a dielectric material between said lower electrode and said upper electrode, wherein said dielectric material has a conducting channel disposed therethrough which couples electrically with said stud, and wherein said channel is filled with tungsten.

2. A capacitor as in claim 1, further comprising a plurality of portions of layers on a field oxide layer, wherein upper surface of said field oxide layer and surfaces of said portions define a gap, said gap being filled by said stud.

3. A capacitor as in claim 2, further comprising a gap liner between said stud and surfaces of said portions and said field oxide layer defining said gap.

4. A capacitor as in claim 3, wherein said gap liner comprises one or more materials selected from the group consisting of titanium and titanium nitride.

5. A capacitor as in claim 2, wherein one or more of said portions comprise silicon nitride.

6. A capacitor as in claim 2, wherein one or more of said portions comprise oxide.

7. The capacitor of claim 1, further comprising a channel liner between said tungsten which fills said channel and the insulating material walls defining said channel.

8. The capacitor of said 7, wherein said channel liner comprises one or more materials selected from the group consisting of titanium and titanium nitride.

9. A capacitor as in claim 1, wherein said upper electrode is a metal.

10. A capacitor as in claim 1, wherein said upper electrode is polysilicon.

11. A capacitor as in claim 1, wherein said upper electrode and said tungsten lower electrode are separated by substantially 0.5 microns.

12. A capacitor as in claim 1, wherein said upper electrode and said tungsten lower electrode are separated by less than 1 micron.

13. A capacitor as in claim 1, wherein said upper electrode and said tungsten lower electrode are separated by a distance in the range 0.1–0.75 microns.

14. A capacitor with a damascene tungsten lower electrode for use with an integrated circuit device, comprising:

a plurality of portions of layers formed on an upper surface of a field oxide layer, wherein the upper surface of said substrate and side surfaces of said portions define a gap;

a lower electrode comprising damascene tungsten filling said gap;

an insulating layer on an upper surface of said stud and said portions, wherein said insulating layer has a conducting channel therethrough which couples electrically with said stud;

an upper electrode on said insulating layer above said stud, said upper electrode being electrically insulated from said stud and said channel; and a contact on said insulating layer and electrically insulated from said upper electrode, said contact being electrically coupled with said stud via said channel.

15. A capacitor with a damascene tungsten lower electrode for use with an integrated circuit device, comprising:

a plurality of portions of layers on a field oxide layer, wherein upper surface of said field oxide layer and side surfaces of said portions define a gap, and said portions comprise a nitride layer including $Si_3N_4$ on said field oxide and an undoped oxide layer on said nitride layer;

a lower electrode comprising damascene tungsten filling said gap;

an insulating oxide layer on upper surface of said stud and said portions, wherein said insulating layer has a conducting channel therethrough which couples electrically with said stud, said channel is filled with tungsten and a channel liner comprising one or more materials selected from the group consisting of titanium and titanium nitride between said tungsten which fills said channel and walls of insulating material defining said channel an upper electrode on said insulating layer above said stud, said upper electrode being electrically insulated from said stud and said channel; and a contact on said insulating layer and electrically insulated from said upper electrode, said contact being electrically coupled with said stud via said channel a gap liner between said damascene tungsten and surfaces of said portions and said substrate defining said gap, wherein said gap liner comprises one or more materials selected from the group consisting of titanium and titanium nitride, wherein said tungsten lower electrode has an upper surface which is substantially coplanar with upper surfaces of said portions, said coplanarity being caused by chemical mechanical polishing of the upper surfaces of said tungsten and said portions, said portions are formed by depositing the nitride layer on said field oxide layer; depositing the oxide layer on said nitride layer; etching a portion of said oxide layer to the nitride layer; and etching said nitride layer beneath said etched portion of said oxide layer to said substrate with an etchant which is selective to nitride, said two etching steps leaving said portions forming and defining said gap, and said upper electrode and said tungsten lower electrode are separated by less than 1 micron.

16. A capacitor with a damascene tungsten stud as a lower electrode for use with an integrated circuit device, comprising:

an upper electrode;

a lower electrode comprising a damascene tungsten stud;

a dielectric material between said lower electrode and said upper electrode; and a plurality of portions of layers on a field oxide layer, wherein upper surface of said field oxide layer and surfaces of said portions define a gap, said gap being filled by said stud.

17. A capacitor as in claim 16, further comprising a gap liner between said stud and surfaces of said portions and said field oxide layer defining said gap.

18. A capacitor as in claim 17, wherein said gap liner comprises one or more materials selected from the group consisting of titanium and titanium nitride.

19. A capacitor as in claim 16, wherein one or more of said portions comprise silicon nitride.

20. A capacitor as in claim 16, wherein one or more of said portions comprise oxide.

21. A capacitor with a damascene tungsten stud as a lower electrode for use with an integrated circuit device, comprising:

an upper electrode;

a lower electrode comprising a damascene tungsten stud; and a dielectric material between said lower electrode and said upper electrode, wherein said upper electrode is polysilicon.

22. A capacitor with a damascene tungsten stud as a lower electrode for use with an integrated circuit device, comprising:

an upper electrode;

a lower electrode comprising a damascene tungsten stud; and a dielectric material between said lower electrode and said upper electrode, wherein said upper electrode and said tungsten lower electrode are separated by substantially 0.5 microns.

* * * * *